United States Patent
Ishikawa

(10) Patent No.: US 6,239,016 B1
(45) Date of Patent: *May 29, 2001

(54) MULTILEVEL INTERCONNECTION IN A SEMICONDUCTOR DEVICE AND METHOD FOR FORMING THE SAME

(75) Inventor: Hiraku Ishikawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/134,938

(22) Filed: Aug. 17, 1998

Related U.S. Application Data

(62) Division of application No. 09/027,491, filed on Feb. 20, 1998, now Pat. No. 5,861,674.

(30) Foreign Application Priority Data

Feb. 20, 1997 (JP) ........................................ 9-36424

(51) Int. Cl.$^7$ ............................................... H01L 21/4763
(52) U.S. Cl. ......................... 438/619; 438/623; 438/624; 438/637; 438/788
(58) Field of Search .................................. 438/618, 622, 438/624, 422, 619, 623, 637, 778, 788; 257/760

(56) References Cited

U.S. PATENT DOCUMENTS

| | | |
|---|---|---|
| 4,012,764 | * 3/1977 | Satonaka ................................. 357/68 |
| 5,200,808 | * 4/1993 | Koyama et al. ..................... 250/750 |
| 5,413,952 | * 5/1995 | Pages et al. ............................. 438/62 |
| 5,437,763 | * 8/1995 | Huang ..................................... 216/18 |
| 5,468,682 | * 11/1995 | Homma ................................. 438/195 |
| 5,626,679 | * 5/1997 | Shimizu et al. ............... 118/723 MR |
| 5,691,573 | * 11/1997 | Avanzino et al. .................... 257/758 |
| 5,792,703 | * 8/1998 | Bronner et al. ...................... 438/620 |

FOREIGN PATENT DOCUMENTS

| | | | |
|---|---|---|---|
| 6014045 | * 7/1985 | (JP) | .......................................... 21/88 |
| 62-5643 | 1/1987 | (JP) | . |
| 63-98134 | 4/1988 | (JP) | . |
| 63-318752 | 12/1988 | (JP) | . |
| 8-125020 | 5/1996 | (JP) | . |

OTHER PUBLICATIONS

Admitted prior art, p. 2, lines 12–22, Fig. 1A.*
Jeng. "A Planarized Multilevel Interconnect Scheme With Embedded Low–Dielectric–Constant Polymers For Sub–Quarter–Micron Applications" *IEEE* pp. 73–74 (1994).

* cited by examiner

*Primary Examiner*—Olik Chaudhuri
*Assistant Examiner*—Kurt Eaton
(74) *Attorney, Agent, or Firm*—Foley & Lardner

(57) ABSTRACT

In a multilevel interconnection structure for a semiconductor device, lower level interconnections 3 are formed on an insulator film 2 formed on a substrate 1, and a silicon oxide film 4a is formed to cover the lower level interconnections 3 and to fill up a region between adjacent lower level interconnections 3, by means of a biased ECR-CVD process so that a cavity 5 is formed in the silicon oxide film 4a between the adjacent lower level interconnections 3. The silicon oxide film 4a is selectively removed from a tolerable region covering the extent in which a hole for the metal pillar 6 is allowed to deviate from a target lower level interconnection 3, and then, another silicon oxide 4b is formed to fill up the removed portion and to cover the first silicon oxide film. The metal pillar 6 is formed to extended through the silicon oxide film 4b filling the removed portion off silicon oxide film 4a, so as to reach the target lower level interconnection 3. On the metal pillar 6, an upper level interconnection is formed. Thus, since the cavity 5 is completely surround by the silicon oxide film 4a, a contact between the cavity 5 and the metal pillar 6 is completely prevented by the silicon oxide film 4a.

8 Claims, 6 Drawing Sheets

MULTILEVEL INTERCONNECTION IN A SEMICONDUCTOR DEVICE AND METHOD FOR FORMING THE SAME

This application is a divisional of application Ser. No. 09/027,491, filed Feb. 20, 1998, now U.S. Pat. No. 5,861,674.

BACKGROUND OF THE INVENTION

1. Field of the Invention

The present invention relates to a semiconductor device and a method for manufacturing the same, and more specifically to a multilevel interconnection in a semiconductor device and a method for forming the same.

2. Description of Related Art

With an increased integrated density and an elevated operation speed of the semiconductor device, microfabrication of an interconnection layer has become remarkable. Therefore, since a fine pattern is formed, a capacitance between interconnections of the same level increases, with the result that the characteristics of the semiconductor device is significantly deteriorated. This capacitance between interconnections will be called a "line-to-line capacitance" in this specification.

In order to reduce the line-to-line capacitance, it was proposed to use an insulator film of a lower dielectric constant. For example, Japanese Patent Application Pre-examination Publication No. JP-A-62-005643, (the content of which is incorporated by reference in its entirety into this application, and also an English abstract of JP-A-62-005643 is available from the Japanese Patent Office and the content of the English abstract of JP-A-62-005643 is also incorporated by reference in its entirety into this application), proposes to form a cavity between adjacent interconnections of the same level, thereby to reduce the line-to-line capacitance. This example is shown in FIG. 1A.

Furthermore, Shin-Puu Jeng, et al. "A Planarized Multi-level Interconnect Scheme With Embedded Low-Dielectric-Constant Polymers For Sub-Quarter-Micron Applications", 1997 Symposium on VLSI Technology Digest of Technical Papers, pp. 73–74, (the content of which is incorporated by reference in its entirety into this application) proposes to form an organic film of a lower dielectric constant only between adjacent interconnections of the same level. This example is shown in FIG. 1B In FIGS. 1A and 1B, Reference Numeral 1 designates a substrate, and Reference Numeral 2 indicates an insulator layer formed on the substrate 1. Reference Numeral 3 shows lower level interconnections 3 formed on the insulator layer 2, and Reference Numerals 4a and 4b denote insulator films formed to cover the lower level interconnections 3. Reference Numeral 5 designates a cavity formed between adjacent lower level interconnection 3, and Reference Numeral 6 indicates a metal pillar extending through the insulator films 4a and 4b to contact with a target one of the lower level interconnection 3. Reference Numeral 7 shows upper level interconnections formed on the insulator film 4b, and one of the upper level interconnections 7 is connected to the metal pillar 7. Reference Numeral 8 denotes an organic film 8, and Reference Numeral 10 designates a hollow formed in the metal pillar 7.

In these prior art examples, if the spacing between interconnections is on the order of sub-microns or less, the metal pillar 6 for electrically connecting the upper level interconnection 7 and the lower level interconnection has often become formed to deviate from the lower level interconnection 3, so that a portion of the metal pillar 6 extends into a region between two adjacent lower level interconnections 3.

As a result, in the example shown in FIG. 1A, the metal pillar 6 reaches the cavity 5 in a deviated portion of the metal pillar 6, so that a gas retained in the cavity 5 is discharged to create the hollow 10 in the metal pillar 6. This results in an increased resistance of a connection resistance and in a lowered reliability. Alternatively, the metal pillar 5 is formed to fill up the cavity 5 between the lower level interconnections 3, which results in an increased leak current between the lower level interconnections 3.

In addition, in the example shown in FIG. 1B, the metal pillar 6 contacts with the organic film 8 in a deviated portion of the metal pillar 6, so that because of a degasification of the organic film 8, the hollow 10 is formed in the metal pillar 6. Similarly, this results in an increased resistance of a connection resistance and in a lowered reliability.

SUMMARY OF THE INVENTION

Accordingly, it is an object of the present invention to provide a semiconductor device and a method for manufacturing the same, which have overcome the above mentioned defects of the conventional ones.

Another object of the present invention is to provide a multilevel interconnection in a semiconductor device in which a metal pillar for connecting interconnections of different levels is stably formed by forming between adjacent interconnections of the same level, an insulator having a lower dielectric constant, such as a cavity and an organic film having a lower dielectric constant, other than a silicon oxide film, and by forming the metal pillar in no contact with the insulator having the lower dielectric constant.

Still another object of the present invention is to provide a method for forming the above mentioned multilevel interconnection in the semiconductor device.

The above and other objects of the present invention are achieved in accordance with the present invention by a semiconductor device including first level interconnections and second level interconnections separated from each other by an interlayer insulator film, and a connection member for electrically connecting one of the first level interconnections and one of the second level interconnections to each other, wherein a capacitance reducing insulator is formed between adjacent first level interconnections to reduce a line-to-line capacitance in the first level interconnections, and a separation film is formed to surround the capacitance reducing insulator so as to isolate the connection member from the capacitance reducing insulator film.

The capacitance reducing insulator can be formed of air, an insulating gas, an insulating liquid, an insulating organic material, an insulating inorganic material excluding a silicon oxide, or a porous insulator.

According to another aspect of the present invention, there is provided a method for forming a semiconductor device including first level interconnections and second level interconnections separated from each other by an interlayer insulator film, and a connection member for electrically connecting one of the first level interconnections and one of the second level interconnections to each other, the method including:

a step for forming first level interconnections on an insulator layer;

a capacitance reducing step for forming a capacitance reducing insulator between adjacent first level interconnections and a separation film on the insulator layer to surround the capacitance reducing insulator but in contact with the first level interconnections;

an interlayer insulator film forming step for forming an interlayer insulator film to cover the separation film, for insulating between the first level interconnections and possible second level interconnections;

a connection step for forming a hole to penetrate through the interlayer insulator film and to reach one of the first level interconnections while avoiding the capacitance reducing insulator surrounded by the separation film and filling up the hole with a conductive material; and a step for forming second level interconnections on the interlayer insulator film so that one of the second level interconnections is in contact with the conductive material filled in the hole and therefore the one of the second level interconnection is electrically connected to the one of the first level interconnections.

For example, the capacitance reducing step is achieved by growing the separation film between the first level interconnections on the insulator layer by means of a plasma chemical vapor deposition process applying a high frequency electric field, so that, as the capacitance reducing insulator, a cavity is simultaneously created in the separation film between adjacent first level interconnections.

The interlayer insulator film forming step is achieved by forming a silicon oxide film as the interlayer insulator film by means of a plasma chemical vapor deposition process applying a high frequency electric field.

In the above mentioned multilevel interconnection, when an insulator material other than the silicon oxide is used as a portion of an insulating film for insulating the first level interconnections from one another and from the second level interconnections, and when a portion of the connection member for connecting one of the first level interconnections to one of the second level interconnections is in contact with a sidewall of the one first level interconnection, the connection member for connecting the one first level interconnection to the one second level interconnection is surrounded by the silicon oxide. Therefore, the connection member is not subjected to any influence of the insulator material other than the silicon oxide.

In the method for forming the above mentioned structure, a portion of an insulating film for insulating the first level interconnections from one another and from the second level interconnections is formed of an insulator material other than the silicon oxide, and the insulator material other than the silicon oxide is selectively removed from a location where the connection member for connecting one of the first level interconnections to one of the second level interconnections is to be formed. Thereafter, as a second insulator film (namely, the interlayer insulator film) a silicon oxide is filled into the selectively removed portion of the insulator material other than the silicon oxide, and the connection member for connecting the one first level interconnection to the one second level interconnection is formed to penetrate through the silicon oxide to reach the one first level interconnection, with the result that the connection member for connecting the one first level interconnection to the one second level interconnection is surrounded by the silicon oxide. Since the second insulator film is formed of the silicon oxide having a high reliability, a stable connection can be obtained.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the present invention will be described with reference to the accompanying drawings.

Figure 1A:
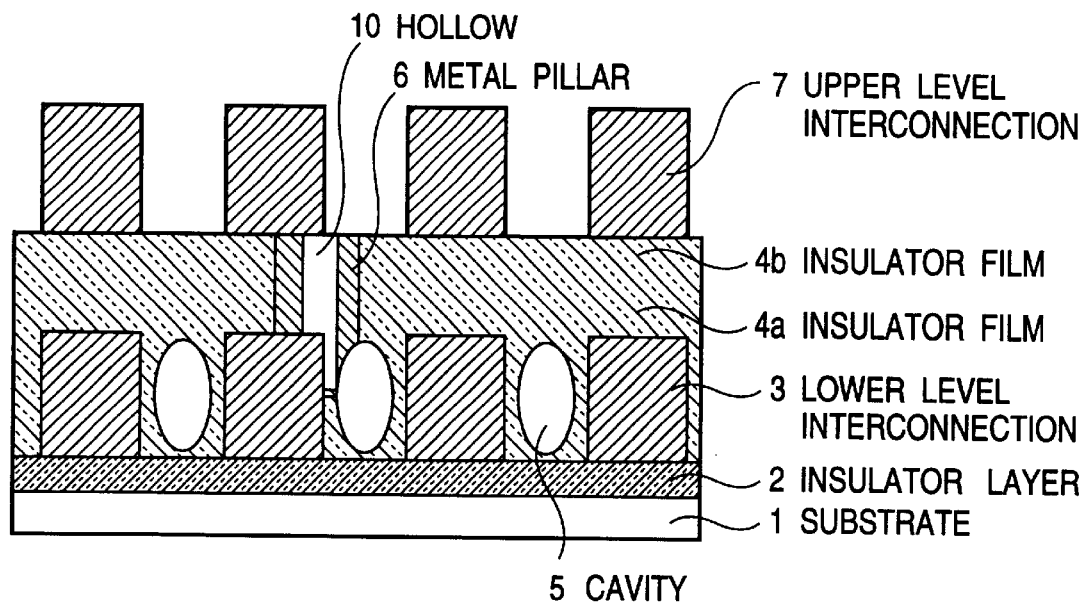
FIGS. 1A and 1B are diagrammatic sectional view of the prior art multilevel interconnection structures.
Figure 1B:
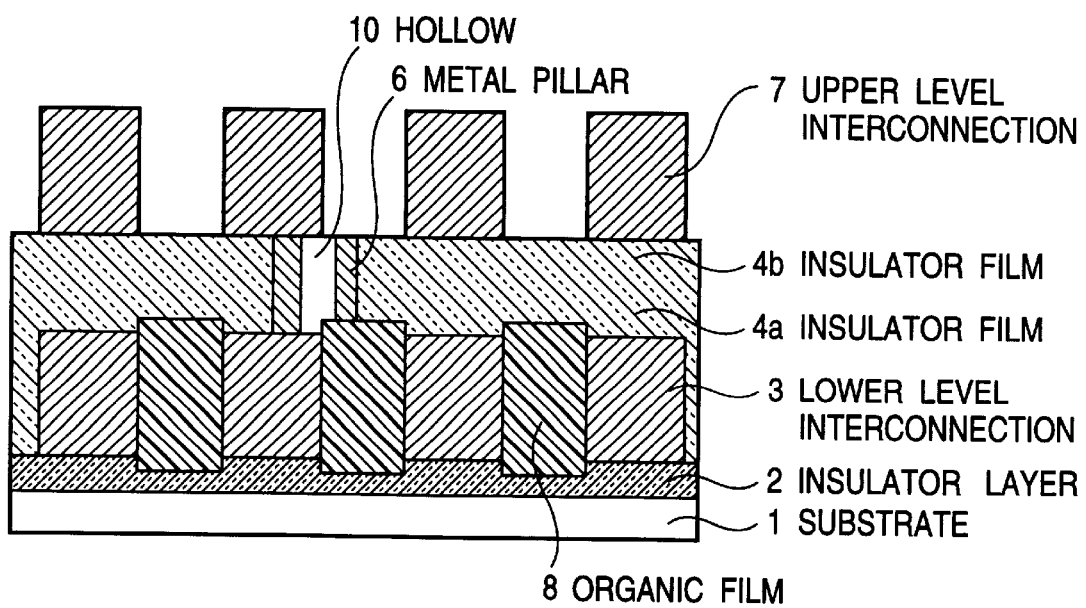
Figure 2:
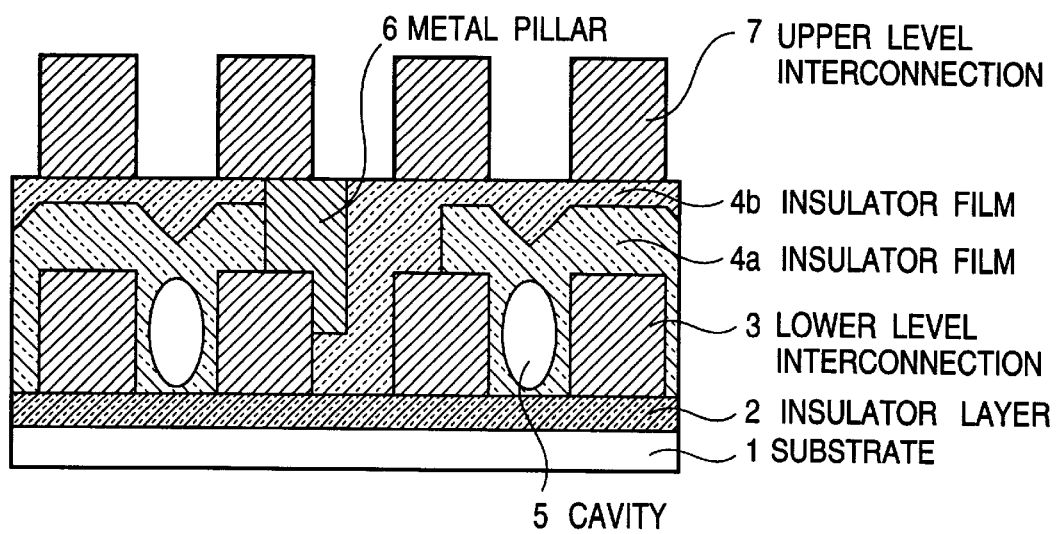
FIG. 2 is a diagrammatic sectional view of an embodiment of the multilevel interconnection structure in the semiconductor device in accordance with the present invention.

Referring to FIG. 2, there is shown a diagrammatic sectional view of an embodiment of the multilevel interconnection structure in the semiconductor device in accordance with the present invention. The shown embodiment includes, as fundamental constituents, first level interconnections 3, capacitance reducing insulators 5, a separation film 4a, an interlayer insulator film 4b, second level interconnections 7, and a vertical connection member 6.

The first level interconnections 3 are formed in a given pattern on an insulator layer 2 formed on a substrate 1.

The capacitance reducing insulators 5 are formed between adjacent first level interconnections 3 and 3 on the insulator layer 2, for the purpose of reducing the line-to-line capacitance of the first level interconnections 3. In the specific embodiment shown in FIG. 2, the capacitance reducing insulators 5 are formed of a cavity, but is not limited to only the cavity. For example, as mentioned hereinbefore, the capacitance reducing insulators 5 can be formed of an insulating gas, an insulating liquid, an insulating organic material, an insulating inorganic material excluding a silicon oxide, or a porous insulator, or a stacked or layered matter of two or more of these materials.

The separation film 4a surrounds the capacitance reducing insulators 5 for preventing the capacitance reducing insulators 5 from being contacted with the vertical connection member 6.

The interlayer insulator film 4b is formed to cover all the surface for insulating between the first level interconnections and the second level interconnections 7.

The second level interconnections 7 are formed in a given pattern on an upper planarized surface of the interlayer insulator film 4b, and one of the second level interconnections 7 is electrically connected through the vertical connection member 6 to one of the first level interconnections 3.

In this embodiment, the insulator layer 2 is preferably formed of an silicon oxide film, a BPSG (borophosphosilicate glass) film, a PSG (phosphosilicate glass) film, a silicon nitride film, or a stacked or layered structure of two or more of these materials. In addition, the first level interconnections 3 and the second level interconnections 6 are preferably formed of polysilicon, a metal silicide, aluminum or alloy thereof, copper or alloy thereof, silver or alloy thereof, or a refractory metal such as tungsten. The separation film 4a and the interlayer insulator film 4b are preferably formed of silicon oxide, fluorine-added silicon oxide or silicon oxynitride film.

In this embodiment, the one first level interconnection 3 and the one second level interconnection 7 are electrically connected to each other by a metal pillar formed as the vertical connection member 6. In forming the metal pillar 6, since there is a limitation in a photolithography, the metal pillar 6 is often formed to partially deviate from the upper surface of the one first level interconnection 3, and the portion of the metal pillar 6 deviated from the upper surface of the one first level interconnection 3 extends into a region between the adjacent first level interconnections 3, as mentioned hereinbefore.

In the prior art examples, when the metal pillar 6 was so formed that a portion of the metal pillar 6 extends into the region between the adjacent first level interconnections 3, since the cavity 5 is formed in the region between the adjacent first level interconnections 3 without being isolated from the metal pillar 6, the metal pillar 6 disadvantageously becomes contacted with the cavity 5 to cause the problems mentioned hereinbefore. In this embodiment, on the other hand, since the cavities 5 formed between the adjacent first level interconnections 3 are maintained in no contact with the metal pillar by the separation film 4a surrounding the metal pillar 6. Therefore, the cavity 5 never gives any adverse effect to the metal pillar 6, so that the metal pillar 6 having a high reliability can be obtained.

Now, the process in accordance with the present invention for forming the multilevel interconnection structure in accordance with the present invention will be described with reference to FIGS. 3A to 3H.

Figure 3A:
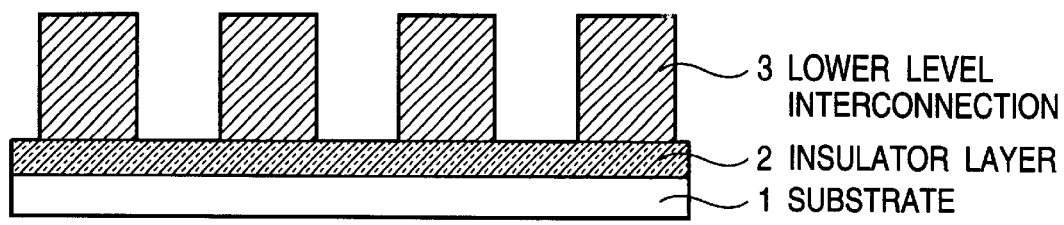
FIGS. 3A to 3H are diagrammatic sectional views for illustrating the process in accordance with the present invention for forming the multilevel interconnection structure in accordance with the present invention.
Figure 3B:
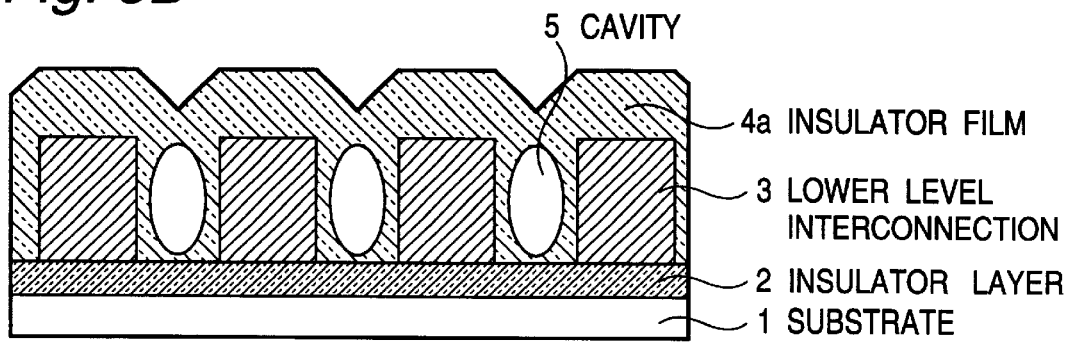

First, as shown in FIG. 3A, as the first level interconnections, lower level interconnections 3 are formed in a given pattern on the insulator layer 2 formed on the substrate 1, and then, as shown in FIG. 3B, as the separation film, a silicon oxide film 4a is formed to cover the lower level interconnections 3 and the insulator layer 2, by means of a biased ECR-CVD (electron cyclotron resonance plasma CVD) process which is one kind of a plasma CVD process applying a high frequency electric field onto the substrate.

Figure 4:
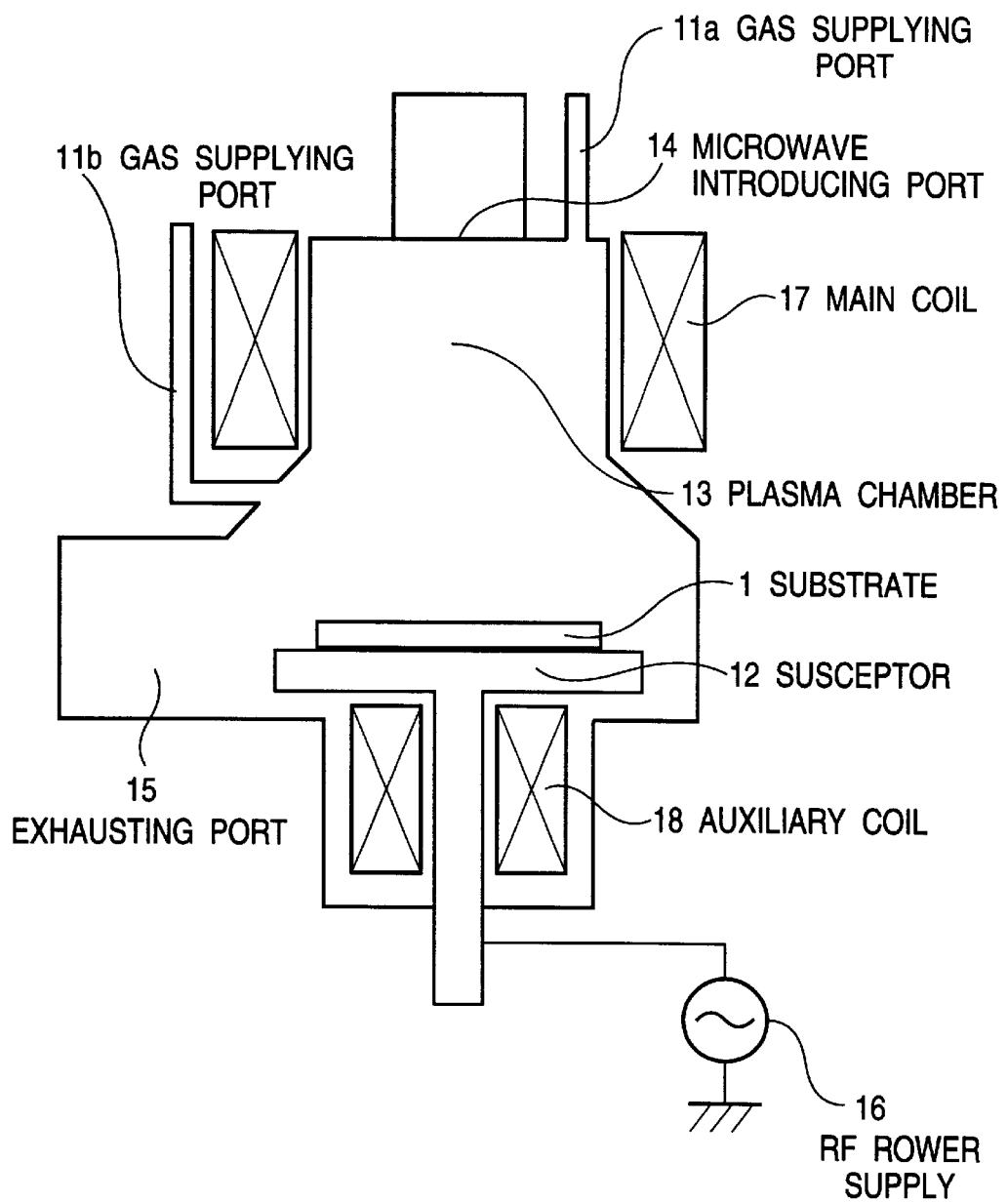
FIG. 4 is a diagrammatic sectional view for illustrating a structure of a biased ECR-CVD apparatus used in the embodiment of the process in accordance with the present invention for forming the multilevel interconnection structure.

Referring to FIG. 4, there is shown a diagrammatic sectional view for illustrating the structure of the biased ECR-CVD apparatus. As shown in FIG. 4, a microwave introducing port 14 is provided above a plasma chamber 13 so that a microwave is introduced through this port 14 into the plasma chamber 13. The plasma chamber 13 includes gas supplying ports 11a and 11b and an exhausting port 15, so that reaction gases are supplied through the gas supplying ports 11a and 11b into the plasma chamber 13, and unnecessary gases are exhausted through the exhausting port 15 from the plasma chamber 13. In the plasma chamber 13, a susceptor 12 is provided. A substrate 1, which is a workpiece, is located on the susceptor 12. This susceptor 12 is connected to a high frequency power supply 16 for a RF biasing. Furthermore, a main coil 17 and an auxiliary coil 18 are provided as shown to generate a magnetic field.

In this biased ECR-CVD apparatus, while an $O_2$ gas is supplied through the gas supplying port 11a, a microwave is supplied, so that a plasma is generated in the plasma chamber 13. In this condition, a silane gas is supplied together with argon through the gas supplying port 11b, so that a silicon oxide film is deposited on the substrate. Simultaneously, the high frequency electric field is applied to the susceptor 12, so that the etching is simultaneously carried out by argon gas plasma. An example of the specific film deposition condition is that the flow rate of the silane is 50 sccm, the flow rate of oxygen is 75 sccm, the flow rate of argon is 70 sccm, the microwave power is 2000 W, the RF biasing power is 1400 W and the film deposition temperature is about 350° C.

When the silicon oxide film 4a is formed as the separation film under the above mentioned film deposition condition, if the aspect ratio of the spacing between adjacent interconnections is not less than 1.5, the cavity 5 is formed as the capacitance reducing insulator, as shown in FIG. 3B.

Figure 3C:
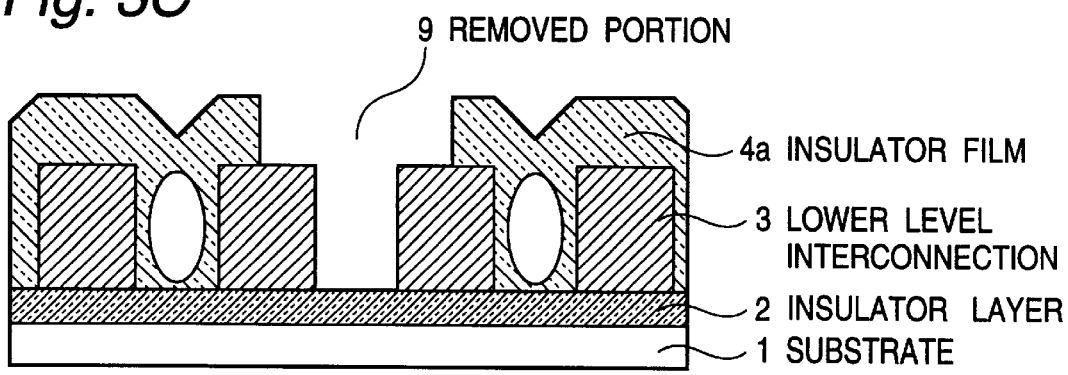

Thereafter, as shown in FIG. 3C, in a position where the metal pillar 6 is to be formed, the silicon oxide film 4a is removed from a tolerable region covering the extent in which a hole for the metal pillar 6 formed by a photolithography and a dry etching is allowed to deviate from a target lower level interconnection 3 to be contacted with the possible metal pillar. Namely, a removed portion 9 is formed in the silicon oxide film 4a. At this time, when two or more metal pillars 6 are to be formed adjacent to each other, the removed portion 4 is formed to extend over a continuous tolerable region covering a plurality of metal pillar formation positions, as shown in FIG. 3E.

Figure 3D:
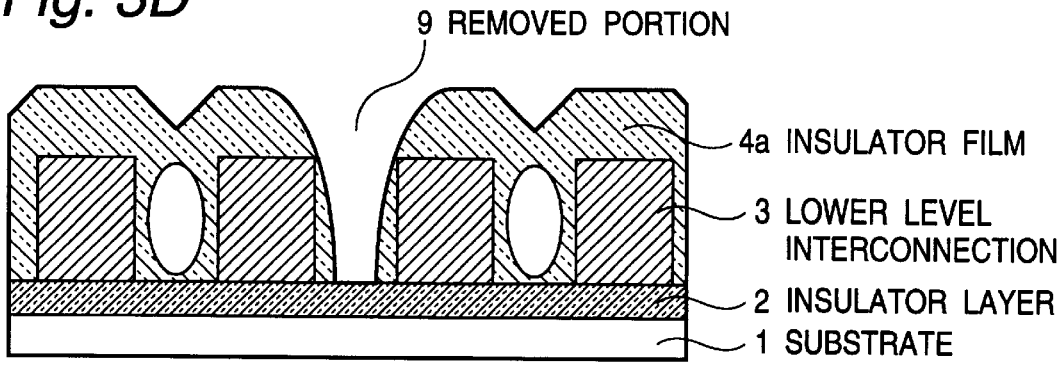
Figure 3E:
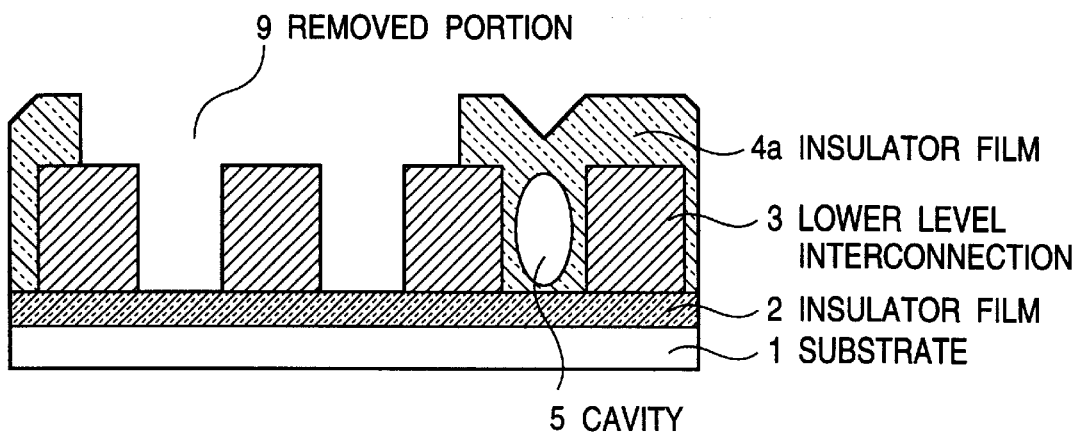

Alternatively, when the silicon oxide film 4a is selectively removed by the dry etching, the silicon oxide film 4a in contact with the target lower level interconnection 3 in the above mentioned tolerable region in which the hole for the metal pillar 6 is allowed to deviate from the target lower level interconnection 3, is not completely removed, but can be rather partially left to form a side wall covering the lower level interconnection 3, as shown in FIG. 3D.

Figure 3F:
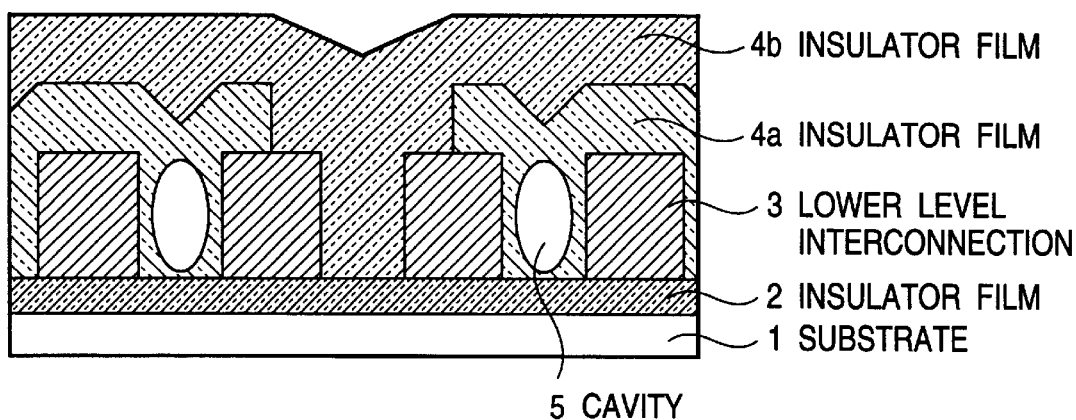

Furthermore, as shown in FIG. 3F, as the interlayer insulator film, a silicon oxide film 4b is deposited to fill up the removed portion 9 and to cover the insulator film 4a, also by the biased ECR-CVD process. In this embodiment, an example of the specific film deposition condition is that the flow rate of the silane is 30 sccm, the flow rate of oxygen is 45 sccm, the flow rate of argon is 70 sccm, the microwave power is 2000 W, the RF biasing power is 1400 W and the film deposition temperature is about 350° C.

Figure 3G:
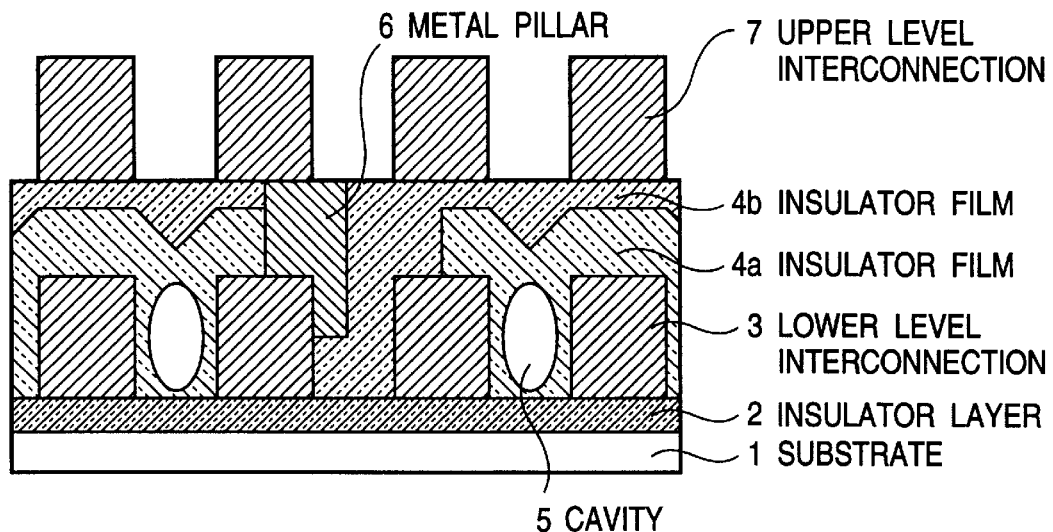
Figure 3H:
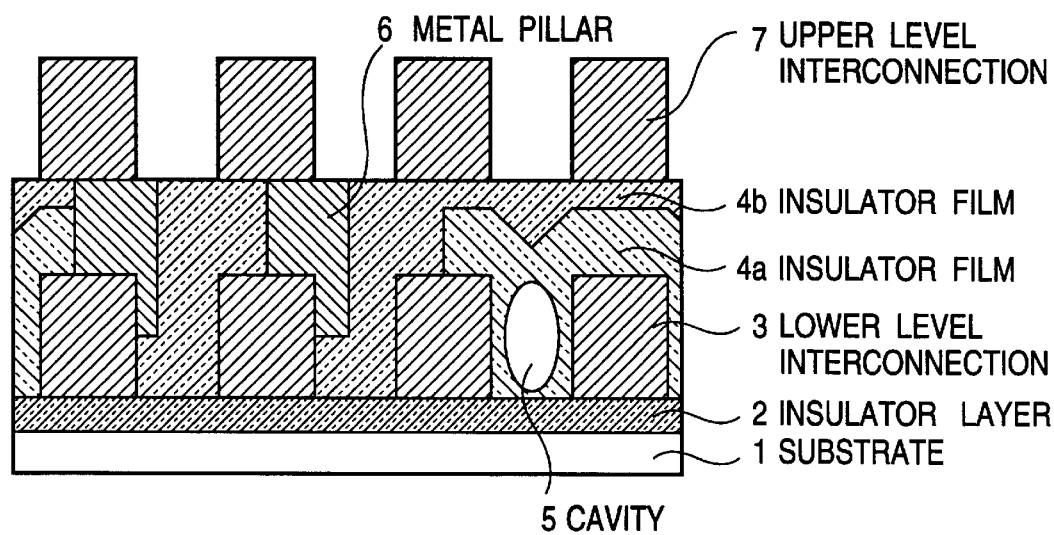

Thereafter, an upper surface of the silicon oxide film 4b is planarized by for example a CMP (chemical mechanical polishing) process, and a hole for the metal pillar 6 is formed to penetrate through the insulator film 4b filled in the removed portion, to reach the target lower level interconnection 3, and then, the hole is filled with a metal, so that the metal pillar 6 is formed in contact with the target lower level interconnection 3, as shown in FIG. 3G. Furthermore, as the second level interconnections, upper level interconnections 7 are formed in a given pattern on the upper surface of the silicon oxide film 4b, as shown in FIG. 3G. Incidentally, when the removed portion 4 is formed to extend over a plurality of metal pillar formation positions as shown in FIG. 3E, two or more metal pillars 6 are formed to penetrate through the insulator film 4b so as to contact with two or more adjacent lower level interconnections as shown in FIG. 3H.

In the above mentioned structure, the metal pillar 6 and the cavity 5 can be prevented from being contacted to each other. As a result, it is possible to connect interconnections, for example, metal interconnections, of different levels, with high stability and high reliability.

The embodiment shown in FIGS. 3A to 3H has two levels of metal interconnection. However, it would be a matter of course to persons skilled in the art that the present invention can be applied to a multilevel interconnection structure including three or more levels of metal interconnection. In addition, in the above mentioned embodiment, the capacitance reducing insulator formed between adjacent interconnections of the same level, has been constituted of cavity, but can be formed of an organic insulator film having a lower dielectric constant, a porous silicon oxide film or a fluorine-added silicon oxide. This would also be a matter of course to persons skilled in the art.

As mentioned above, the capacitance reducing insulator formed between adjacent interconnections is completely surrounded by the separation film, so that the capacitance reducing insulator is maintained to be never contacted with the vertical connection member, with the result that the vertical connection member is protected from the adverse affect of the capacitance reducing insulator. Accordingly, the interconnections of different levels can be surely connected to each other through the vertical connection member, and the vertical connection having a reduced resistance can be formed.

The invention has thus been shown and described with reference to the specific embodiments. However, it should be noted that the present invention is in no way limited to the details of the illustrated structures but changes and modifications may be made within the scope of the appended claims.

What is claimed is:

1. A method for forming a semiconductor device including first level interconnections and second level interconnections separated from each other by an interlayer insulator film, and a connection member for electrically connecting a target first level interconnection to one of the second level interconnections, the method including the steps of:

forming first level interconnections on a substrate;

forming a first insulating film which contains capacitance reducing insulators, to cover said substrate and said first level interconnections such that a capacitance reducing insulator surrounded by said first insulating film is located between adjacent first level interconnections;

removing said first insulating film above a target first level interconnection and the capacitance reducing insulator and said first insulating film between said target first level interconnection and a first level interconnection adjacent to said target first level interconnection;

forming a second insulating film over said first insulating film to fill the removed portion of said first insulating film;

forming said connection member penetrating through said second insulating film to reach said target first level interconnection; and forming second level interconnections on said second insulating film such that one of said second level interconnections contacting with said connection member electrically connects said target first level interconnection through said connection member.

2. A method claimed in claim 1 wherein said first insulating film containing said capacitance reducing insulators is formed by growing said first insulating film on said substrate and said first level interconnections by means of a plasma chemical vapor deposition process applying a high frequency electric field such that a cavity is simultaneously created in said first insulating film between adjacent first level interconnections.

3. A method claimed in claim 1 wherein forming said second insulating film is formed of a silicon oxide film.

4. A method claimed in claim 1 wherein said capacitance reducing insulators are formed of one selected from the group consisting of a cavity, an insulating gas, an insulating liquid, an insulating organic material, and a porous insulator.

5. A method for forming a semiconductor device including first level interconnections and second level interconnections separated from each other by an interlayer insulator film, and a connection member for electrically connecting a target first level interconnection to one of the second level interconnections, the method including the steps of:

forming first level interconnections on an insulator layer;

forming a first insulating film which contains capacitance reducing insulators, to cover said insulator layer and said first level interconnections such that a capacitance reducing insulator surrounded by said first insulating film is located between adjacent first level interconnections;

removing said first insulating film above a target first level interconnection and the capacitance reducing insulator and said first insulating film between said target first level interconnection and a first level interconnection adjacent to said target first level interconnection;

forming a second insulating film over said first insulating film to fill the removed portion of said first insulating film;

forming a hole through said second insulating film to said target first level interconnection;

filling up said hole with a conductive material to form said connection member; and forming second level interconnections on said second insulating film such that one of said second level interconnections contacting with said connection member electrically connects said target first level interconnection through said connection member.

6. A method claimed in claim 5 wherein said first insulating film containing said capacitance reducing insulators is formed by growing said first insulating film on said insulator layer and said first level interconnections by means of a plasma chemical vapor deposition process applying a high frequency electric field such that a cavity is simultaneously created in said first insulating film between adjacent first level interconnections.

7. A method claimed in claim 5 wherein forming said second insulating film is formed by depositing a silicon oxide film using a plasma chemical vapor deposition process applying a high frequency electric field.

8. A method claimed in claim 5 wherein said capacitance reducing insulators are formed of one selected from the group consisting of a cavity, an insulating gas, an insulating liquid, an insulating organic material, and a porous insulator.

* * * * *